United States Patent [19]

Shimazaki et al.

[11] Patent Number: 4,713,616
[45] Date of Patent: Dec. 15, 1987

[54] NUCLEAR MAGNETIC RESONANCE IMAGING APPARATUS

[75] Inventors: Toru Shimazaki; Hiroyuki Matsuura, both of Tokyo, Japan

[73] Assignees: Yokogawa Electric Corporation; Yokogawa Medical Systems, Limited, both of Tokyo, Japan

[21] Appl. No.: 864,000

[22] Filed: May 16, 1986

[30] Foreign Application Priority Data

May 29, 1985 [JP] Japan .................. 60-116180

[51] Int. Cl.[4] ........................... G01R 33/20
[52] U.S. Cl. ..................... 324/309; 324/312
[58] Field of Search ........ 324/309, 312, 307; 364/414

[56] References Cited

U.S. PATENT DOCUMENTS 4,573,014 2/1986 Riederer ............... 324/307
4,583,044 4/1986 Case et al. ............ 324/309

Primary Examiner—Stewart J. Levy
Assistant Examiner—Louis M. Arana
Attorney, Agent, or Firm—Moonray Kojima

[57] ABSTRACT

An NMR imaging apparatus, wherein a 180° RF pulse is applied shortly after the termination of the 90° RF pulse, and wherein after such 180° pulse application, to collection of spins and after collection of spins to dispersion of spins are sampled asymmetrically, whereby Fourier transformation takes place by interpolating missing data on a Fourier plane, and by operating on the data, image is accurately reconstructed. The novel pulse sequence improves the S/N ratio and reduces deterioration of images.

2 Claims, 7 Drawing Figures

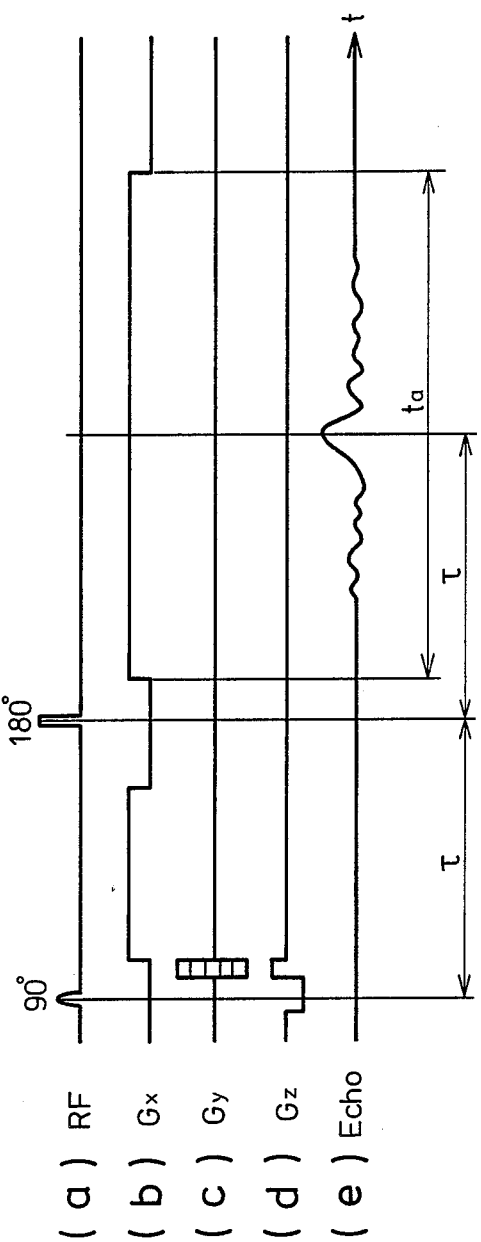

NUCLEAR MAGNETIC RESONANCE IMAGING APPARATUS

BACKGROUND OF THE INVENTION

1. Field of Invention.

This invention relates to a nuclear magnetic resonance imaging apparatus, and more particularly to improvements therein involving a novel pulse sequence and novel processing of data to improve the signal to noise ratio.

2. Description of Prior Art.

Nuclear magnetic resonance (called "NMR") imaging apparatus are known in the art and can examine a plane section of an object by using a planar method, namely, a Fourier transformation method (called "FT" method). Such Fourier transformation methods may be divided into two types, (1) FID method wherein an FID signal is measured and is then Fourier transformed, and (2) Spin Echo method wherein a spin echo signal is measured and is then Fourier transformed.

In the FID method, an FID signal is obtained by a pulse sequence, such as illustrated in FIG. 6. Specifically, having been given a Z gradient magnetic field $G_z{}^{31}$ (FIG. 6, line (d)), a plane of the object is excited by impressing thereon a 90° RF pulse, such as shown in FIG. 6, line (a). Then, Z gradient magnetic field $G_z{}^+$ and Y gradient magnetic field $G_y$ (FIG. 6, lines (c) and (d)) are impressed, and thereafter the X gradient magnetic field $G_x$ is impressed while terminating the Z gradient magnetic field $G_z{}^+$ and the Y gradient magnetic field $G_y$. Then, the FID signals are measured (FIG. 6, line (e)).

In the Spin Echo method, echo signals are obtained by a pulse sequence as shown in FIG. 7. Specifically, having been given a Z gradient magnetic field $G_z{}^-$ (see FIG. 7, line (d)), a plane of the object is excited by impressing on the object a 90° RF pulse (FIG. 7, line (a)), then a Z gradient magnetic field $G_z{}^+$ (FIG. 7, line (d)) and a Y gradient magnetic field $G_y$ (FIG. 7, line (c)) are impresed, and thereafter an X gradient magnetic field $G_x$ (FIG. 7, line (b)) is impressed while terminating the Z gradient magnetic field and the Y gradient magnetic field. During the impression of the 180° RF pulse (FIG. 7, line (a)), X gradient magnetic field $G_x$ is terminated (FIG. 7, line (b)). After that, the X gradient magnetic field $G_x$ is impressed on the object again. Although spins are still in the relaxation state, the spin echo signal becomes maximum after t time period from the 180° RF pulse and then attenuated, as shown in FIG. 7, line (e).

To accomplish Fourier transformation, it is necessary that the data at the positive and negative times be zero at the center time point of a signal.

However, in the FID method, zero time point is not apparent ($t_{FID}$ of FIG. 6 is not the zero time point), and phase rotation (which is different according to the area) occurs due to non-uniform distribution of magnetic field by the time $t=t_{FID}$ from the time of excitation of a 90° RF pulse (i.e. from the center of the 90° RF pulse on a time scale) to the FID signals, and it is difficult to assume data (that is to produce the data) of the negative time. Consequently, one problem with this method is that the reconsitituted image is subjected to deformation and is unclear.

On the other hand, in the Spin Echo method, data assumption or preparation is not necessary because the center of the echo signal (the point of time of 2t time from the application of the 90° RF pulse). However, even after 2t time, the phase displacement cannot be focused based on the original transverse relaxation, and the absolute amount of magnetization is reduced in correspondence to $T_2$ attenuation, and the signals become smaller thus causing a disadvantageous S/N ratio.

SUMMARY OF THE INVENTION

Accordingly, an object of the invention is to overcome the aforementioned and other deficiencies and disadvantages of the prior art.

Another object is to provide an NMR imaging apparatus which utilizes a combination of the FID method and the Spin Echo method, and which utilizes a pulse sequence that causes easy assumption of data and also minimizes deterioration of image at a S/N ratio equal to that of the FID method.

BRIEF DESCRIPTION OF THE DRAWING

FIG. 7, comprising lines (a)-(e), is a wave chart depicting a pulse sequence used in the Spin Echo method.

DETAILED DESCRIPTION OF PREFERRED EMBODIMENTS

Figure 1:
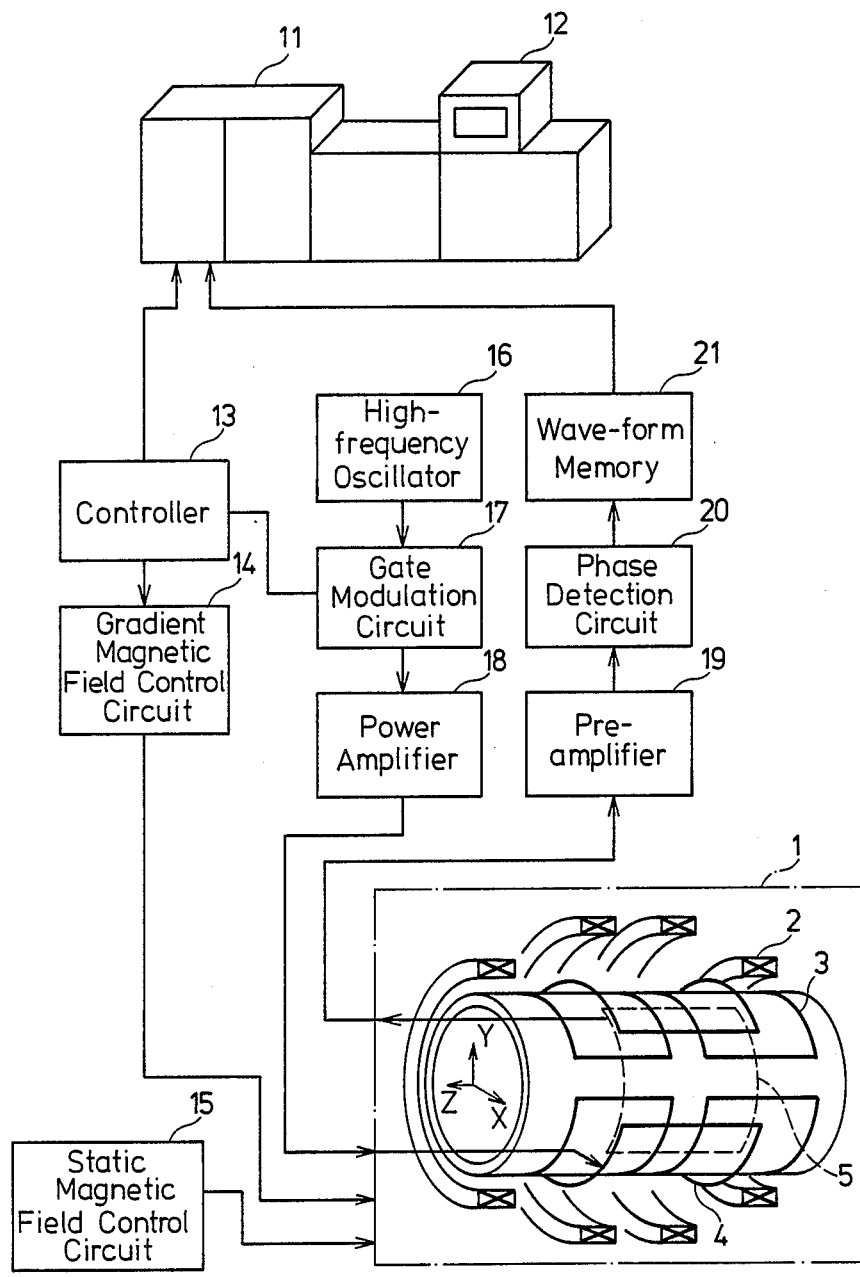
FIG. 1 is a diagrammatic view depicting an illustrative embodiment of the invention.

Turning to FIG. 1, there is depicted an NMR apparatus comprising a magnet assembly 1 having an opening for insertion of an object to be examined. Around this opening are disposed a main magnetic field coil 2 for impressing a uniform static magnetic field $H_c$ on the object, gradient magnetic field coils 3, comprising X gradient, Y gradient and Z gradient magnetic field coils for individually producing gradient magnetic fields which are impressed on the object, an RF transmission coil 4 for impressing a high frequency pulse for exciting atomic nuclear spins in the object, and a receiving coil 5 for detecting NMR signals emanated from the object.

The main magnetic field coil 2, the gradient magnetic fields 3 comprising the $G_x, G_y$ and $G_z$ coils, the RF coil 4, and the NMR receiving coil 5, are connected respectively to a static magnetic field circuit 15, gradient magnetic field control circuit 14, electric power amplifier 18, and a pre-amplifier 19.

A controller 13 is connected to various system components as depicted, such as to circuit 14, circuit 17 and computer 11, and controls the various system components to control the sequence of generation of gradient magnetic field and high frequency magnetic field and to direct the obtained NMR signal to a wave form memory 21.

Gate modulation circuit 17 suitably modulates a high frequency signal output from high frequency oscillator 16 (known also as a radio frequency or RF signal), by a control signal applied from controller 13, and produces high frequency pulses of a predetermined phase. The high frequency pulses are applied to the RF transmission coil 4 via RF power amplifier 18.

Phase detection circuit 20 detects the phase of an NMR signal supplied via pre-amplifier 19 with reference to the output signal of the oscillator 16 and wave form memory 21 for storing the detected wave form signal obtained from pre-amplifier 19 via circuit 20. The wave form memory 21 includes an analog to digital (A/D) converter and is connected to computer 11.

Computer 11 receives a signal from memory 21 and then processes the signal to obtain an image of the plane section of the object, and then displays the image on a display 12, which may be a television monitor.

The term control means includes a predetermined functional portion of controller 13 and computer 11.

Figure 2:
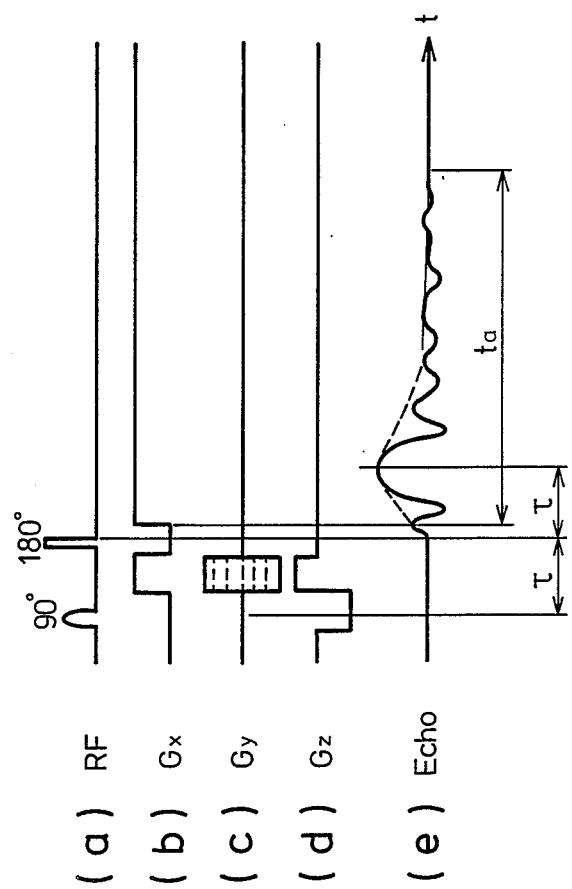
FIG. 2, comprising lines (a)-(e) is a wave chart depicting a pulse sequence used with the embodiment of FIG. 1.

The operation of the FIG. 1 embodiment will now be described with reference to FIG. 2. A 90° RF pulse, such as shown in FIG. 2, line (a), is generated via gate modulation circuit 17, based on a control signal supplied by controller 13. This 90° RF pulse is then applied to RF coil 4 via amplifier 18 to excite the object. Concurrently, a negative Z gradient magnetic field $G_z^-$ is impressed on the object (FIG. 2, line (b)) to selectively excite only the spins which are disposed in a desired slice plane.

Then, phase encoding takes place by impressing on the object a Y gradient magnetic field $G_y$ (FIG. 2, line (c)), while at the same time impressing an X gradient magnetic field $G_x$ (FIG. 2, line (b)), to thereby prepare for the observation of the echo signal. Concurrently, as shown in FIG. 2, line (d), the Z gradient magnetic field being applied, is changed from negative to positive, i.e. to $G_z^+$.

Subsequently, when the gradient magnetic fields $G_x, G_y, G_z$, are terminated, a 180° RF pulse is impressed on the object to invert the spins. Then, gradient magnetic field $G_x$ is impressed on the object, to generate an echo signal (FIG. 2, line (e)) which is thus generated and detected by coil 5. The detected spin echo signal is stored in wave form memory 21 via pre-amplifier 19 and phase detection circuit 20.

The echo signal thus obtained corresponds to a single line of a two dimensional Fourier Transformation of the spin density distribution in the slice plane. Accordingly, by collecting a series of data while changing the size of the gradient magnetic fields, namely, the amount of pahse encoded for each view, it is possible to obtain a reconstituted image as a two dimensional Fourier inverted transformation of the collected data which takes place.

In the above discussed operation, the interval between the 90° RF pulse application and the 180° RF pulse application is reduced to a minimum, so that the peak of the resulting echo signal comes after a lapse of a short amount of time 2t from the time of the excitation of the 90° RF pulse. At that time, data is lacking before negative time t, measured from the time of the peak of the echo and considering the peak echo signal to be at zero point of time (i.e. the point in time when all the spins are coincident in phase). Then, utilizing the data during the positive time after the zero time point of the echo signal peak, the data which is lacking are generated from the phase continuity and amplitude continuity conditions. This data assumption and Fourier transformation are then processed by the computer 11 to produce the reconstructed image.

Figure 3:
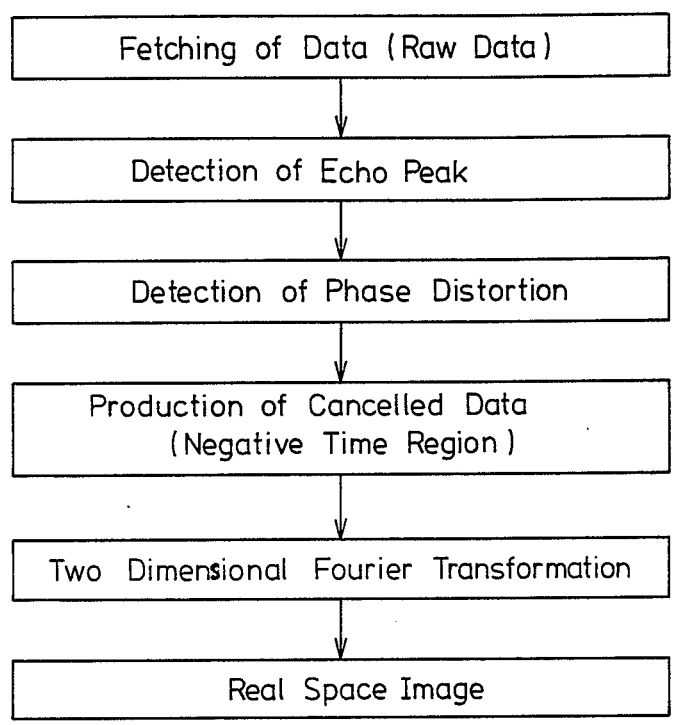
FIG. 3 is a flow chart depicting the flow of image data processing.

FIG. 3 illustrates the flow of processing steps, from the step of measuring the echo signal to the step of obtaining the reconstructed image. More specifically, the echo signals generated by the above described novel pulse sequence, are fetched from the memory 21 as they are analog to digital transformed one after another. Then, the peak of the echo signal is detected. Since this time point is a zero time point, phase distortion of the data during negative time is detected, based on the data occuring during positive time. This enables generation of the lacking data. Then, data in the positive and negative time regions spanning the desired time range are produced. Next, two dimensional Fourier transformation is obtained based on the obtained data, to thereby produce the real space image.

As described above, shortly after the excitation of the 90° RF pulse, namely, while T2 relaxation time is small, data are fetched and are extended or assumed in a perfect two dimensional Fourier plane, thus providing a reconstructed image which, advantageously, is free from any distortion.

It is not absolutely necessary to assume or generate data which is missing during the negative time. If continuity of data is compensated for, there would be no substantial problem even when the data in negative time is zero.

Figure 4:
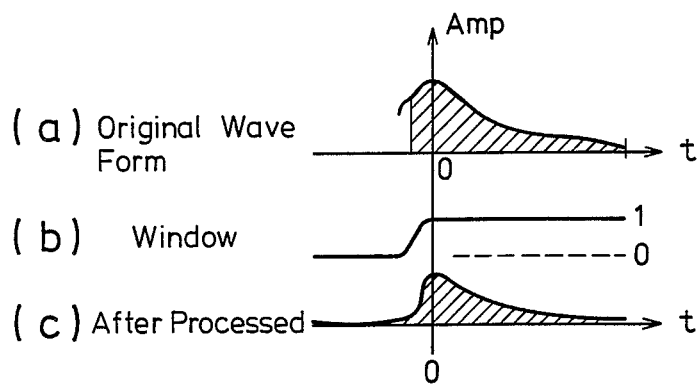
FIG. 4 comprising lines (a)-(c), is a wave chart depicting an example of processing wherein discontinuity of data is compensated.

As an example of the process of compensating for continuity of data, a honing window of the function, such as shown in FIG. 4, line (b), may be placed on the original wave form, e.g. one view, such as shown in FIG. 4, line (a), at the point of data discontinuity to obtain a wave form, such as shown in FIG. 4, line (c), which has its discontinuity compensated for.

Figure 5:
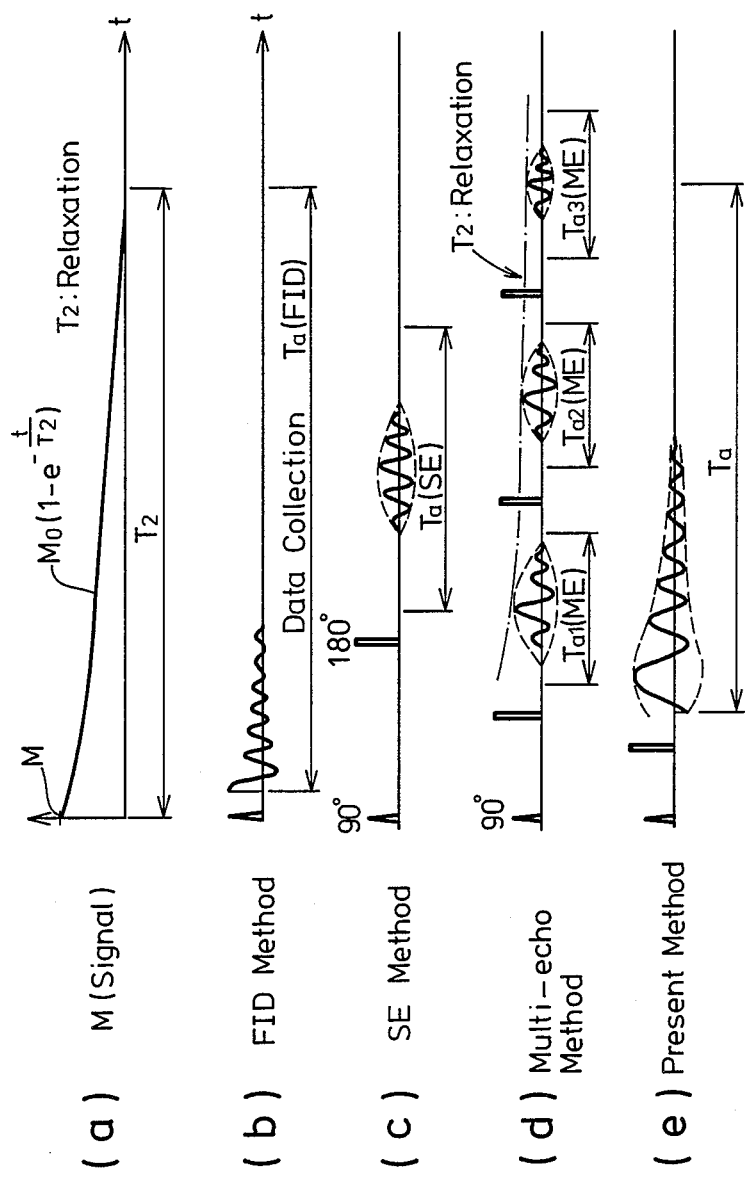
FIG. 5, comprising lines (a)-(e), is a wave chart depicting comparison of the invention with echo signals obtained by prior art methods.
Figure 6:
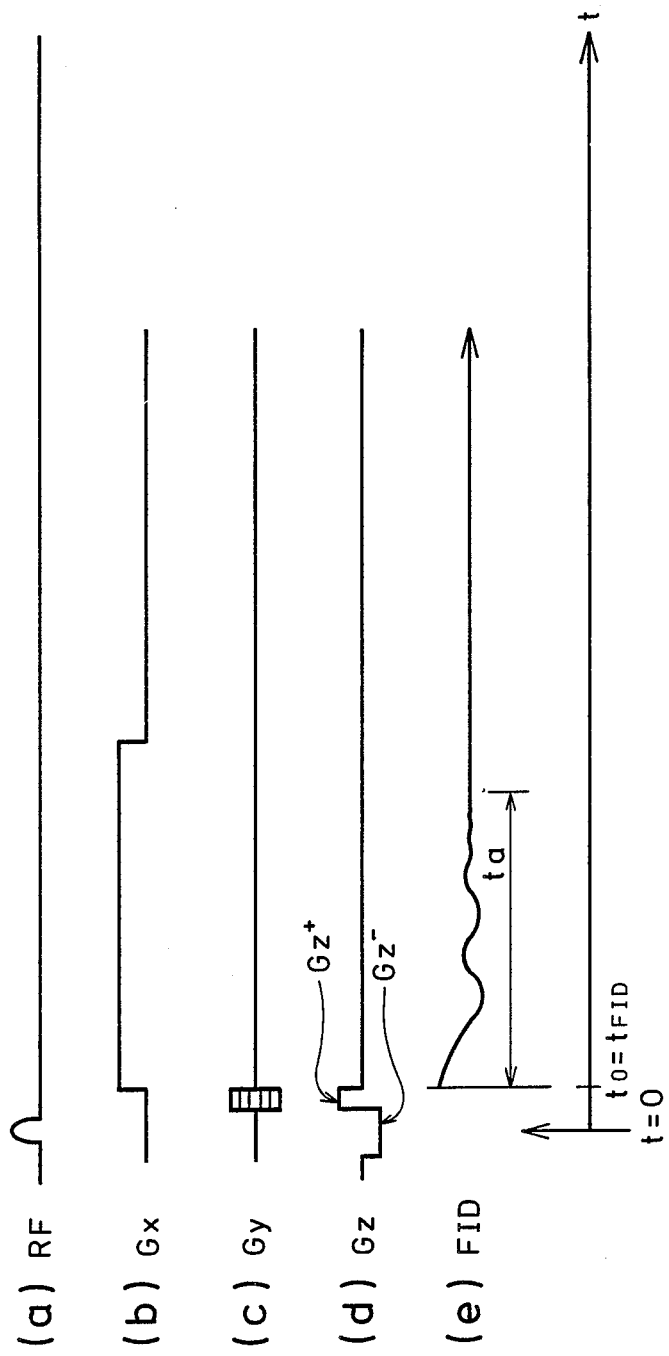
FIG. 6, comprising lines (a)-(e), is a wave chart depicting a pulse sequence used in the FID method.

FIG. 5, comprising lines $(a)$–$(e)$ schematically illustrates wave forms which compare the echo signals produced by the invention against echo signals produced by the prior art methods, such as the FID method, Spin Echo method, and the Multi-echo method. Lines $(b)$–$(e)$ are described using the same time axis, and show the mutual time relationships.

The signal to noise ratio (S/N ratio) is as follows.

$$S/N \text{ ratio } \alpha \sqrt{\frac{\Sigma T_a}{T_2}}$$

wherein $T_a$ is the time period for measuring the echo signal, $T_2$ is the period of time for relaxation of the object. The S/N ratio in the invention is substantially at least as good as, and in most cases, better, than that found in the FID method, and far superior to the S/N ratios found in the Multi-echo method and the Spin Echo method. On the other hand, in terms of image quality, the invention is at least as good as, and in most cases, better than that found in Spin Echo method and the Multi-echo method, and far superior to the FID method.

With the invention, it is possible to obtain an NMR imaging apparatus which adopts a novel pulse sequence that allows for easy assumption or generation of missing data, and also reduces deterioration of image at a signal to noise (S/N) ratio either at least as equal to, but mostly, far superior to the prior art methods. Also, the invention has many advantages, such as, for example, the invention is easier to use than the FID method because the zero point time is clearly defined and the phase distortion can be readily compensated for. Also, the invention has a better S/N ratio than the prior art, especially the Spin Echo method and the Multi-echo method. This is due partly to there being no wasted time to the time an echo signal is generated, and there being no wasted time in impressing an inverted pulse as necessary with the Multi-echo method, and also due partly because very little attenuation of the signal occurs to the relaxation of spin as occurs in the prior art.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A method of obtaining an NMR image of a plane section of an object to be examined, comprising the steps of
   concurrently impressing a 90° RF exciting pulse to excite said object and a negative Z gradient magnetic field to selectively excite only the spins in the plane section under examination;
   after termination of said 90° RF pulse, concurrently impressing a positive X gradient magnetic field, a Y gradient magnetic field and changing the negative Z gradient magnetic field to a positive Z gradient magnetic field, thereby to phase encode and prepare for observation of the echo spins;
   concurrently terminating said X gradient magnetic field, said Y gradient magnetic field, and said Z gradient magnetic field, and concurrently therewith impressing a 180° RF exciting pulse on said object to invert the spins;
   terminating said 180° RF exciting pulse;
   impressing an X gradient magnetic field to generate an echo signal on a receiving coil;
   detecting the phase and amplitude of said echo signal;
   storing said echo signal in a memory and obtaining a two dimensional Fourier transform thereof;
   generating a signal to substitute for data issing during a negative time from the detected phase and amplitude continuity conditions; and
   operating on said Fourier transform and said generated signal substituting for the missing data, to thereby produce a reconstructed image.

2. The method of claim 1, wherein the 90° and 180° pulses are applied and terminated so that time t is the time period from the time the 90° pulse is terminated to the time the 180° pulse is terminated, and said time t is equal to the time period from the time of termination of the 180° pulse to the peak of the echo signal.

* * * * *